US009453688B2

United States Patent
Yang

(10) Patent No.: US 9,453,688 B2
(45) Date of Patent: Sep. 27, 2016

(54) HEAT DISSIPATION UNIT

(71) Applicant: ASIA VITAL COMPONENTS CO., LTD., New Taipei (TW)

(72) Inventor: Hsiu-Wei Yang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 579 days.

(21) Appl. No.: 14/034,562

(22) Filed: Sep. 24, 2013

(65) Prior Publication Data

US 2015/0083372 A1     Mar. 26, 2015

(51) Int. Cl.
*F28D 15/04*     (2006.01)
*F28D 15/02*     (2006.01)
*H01L 23/427*     (2006.01)

(52) U.S. Cl.
CPC .............. *F28D 15/04* (2013.01); *F28D 15/02* (2013.01); *H01L 23/427* (2013.01); *H01L 2924/0002* (2013.01)

(58) Field of Classification Search
CPC ..... F28D 15/04; F28D 15/02; H01L 23/427; H01L 2924/0002; H01L 2924/00; H05K 7/20336
USPC ........................................ 165/104.26, 104.21
See application file for complete search history.

(56) References Cited

U.S. PATENT DOCUMENTS

| | | | | |
|---|---|---|---|---|
| 6,250,378 B1 * | 6/2001 | Kobayashi | .......... | F28D 15/0266 165/104.33 |
| 7,445,385 B2 * | 11/2008 | Lin | .......... | F28D 15/02 165/288 |
| 2010/0006267 A1 * | 1/2010 | Meyer, IV | .......... | F28D 15/0233 165/104.26 |
| 2010/0044014 A1 * | 2/2010 | Ho | .......... | F28D 1/035 165/104.26 |
| 2010/0263836 A1 * | 10/2010 | Figus | .......... | F28D 15/043 165/104.26 |
| 2011/0000647 A1 * | 1/2011 | Hou | .......... | F28D 15/043 165/104.26 |
| 2011/0088873 A1 * | 4/2011 | Yang | .......... | F28D 15/046 165/104.26 |
| 2011/0088875 A1 * | 4/2011 | Hou | .......... | F28D 15/0266 165/104.26 |
| 2011/0198057 A1 * | 8/2011 | Lange | .......... | F28D 15/0233 165/104.26 |
| 2011/0277967 A1 * | 11/2011 | Fried | .......... | F28D 15/0266 165/104.26 |
| 2013/0206369 A1 * | 8/2013 | Lin | .......... | F28D 15/043 165/104.26 |
| 2013/0228311 A1 * | 9/2013 | Wu | .......... | B21D 53/02 165/104.26 |
| 2013/0312939 A1 * | 11/2013 | Uchida | .......... | F28D 15/04 165/104.26 |

FOREIGN PATENT DOCUMENTS

CN     203120347 U     8/2013

* cited by examiner

*Primary Examiner* — Tho V Duong
*Assistant Examiner* — Raheena Rehman
(74) *Attorney, Agent, or Firm* — C. G. Mersereau; Nikolai & Mersereau, P.A.

(57) ABSTRACT

A heat dissipation unit includes a housing and a heat pipe. The housing has a chamber in which a working fluid is contained. Multiple support posts and multiple fixing members are disposed in the chamber. The heat pipe has a heat absorption section positioned in the chamber of the housing and securely supported by the fixing members, and a heat dissipation section extending from the heat absorption section through the housing and positioned outside the chamber of the housing.

13 Claims, 5 Drawing Sheets a major obstacle to having better performance of the electronic apparatus and system. In order to solve the heat dissipation problem of the components in the electronic apparatuses, various vapor chambers and heat pipes with better heat conduction performance have been developed.

HEAT DISSIPATION UNIT

BACKGROUND OF THE INVENTION

1. Field of the Invention

The present invention relates generally to a heat dissipation unit, and more particularly to a heat dissipation unit, which is a combination of a vapor chamber and a heat pipe.

2. Description of the Related Art

There is a trend to develop thinner and thinner electronic apparatuses nowadays. The ultra-thin electronic apparatus includes miniaturized components. The heat generated by the miniaturized components of the electronic apparatus has become a major obstacle to having better performance of the electronic apparatus and system. In order to solve the heat dissipation problem of the components in the electronic apparatuses, various vapor chambers and heat pipes with better heat conduction performance have been developed.

The vapor chamber has a rectangular housing and capillary structures formed on inner wall face of the chamber of the housing. A working fluid is filled in the housing. One face (the evaporation section) of the housing is attached to a heat generation component (such as a central processor or a Northbridge/Southbridge chipset) to absorb the heat generated by the heat generation component. Accordingly, the liquid working fluid in the evaporation section of the housing evaporates into vapor working fluid to transfer the heat to the condensation section of the housing. The vapor working fluid is cooled and condensed into liquid phase. Under gravity or capillary attraction of the capillary structures, the liquid working fluid flows back to the evaporation section for next vapor-liquid circulation. Accordingly, the heat can be spread and dissipated.

The working principle of the heat pipe is similar to that of the vapor chamber. Metal powder is filled into the interior of a hollow circular tube. Then the metal powder is sintered to form an annular capillary structure on inner wall face of the heat pipe. Then the heat pipe is vacuumed and a working fluid is filled into the heat pipe. Finally, the heat pipe is sealed to form the heat pipe structure. The liquid working fluid in the evaporation section of the housing is heated to evaporate into vapor working fluid. The vapor working fluid diffuses to the condensation end to transfer the heat to the condensation end. During the diffusion, the vapor working fluid is gradually cooled and condensed into liquid phase. Under capillary attraction of the capillary structure, the liquid working fluid flows back to the evaporation section for next vapor-liquid circulation.

In comparison with the vapor chamber, the heat pipe conducts heat in a different manner. The vapor chamber serves to two-dimensionally face-to-face transfer heat, while the heat pipe serves to one-dimensionally transfer heat.

Moreover, the conventional vapor chamber can provide heat spreading effect. However, there is a problem existing in the vapor chamber. That is, the vapor chamber transfers heat in such a manner that the vapor chamber absorbs heat from one face to evaporate the working fluid into vapor phase. The vapor working fluid diffuses to the condensation end to transfer the heat to the other face. In other words, the vapor chamber simply transfers heat from one face to the other face to achieve heat spreading effect. The vapor chamber can hardly transfer the absorbed heat to a remote end for dissipating the heat as the heat pipe. Accordingly, the vapor chamber only serves to uniformly face-to-face transfer heat by large area, while failing to transfer heat to a remote end. In the case that the heat is not dissipated in time, the heat will accumulate around the heat source.

Therefore, it has become a critical topic how to improve the current heat dissipation technique and greatly enhance heat transfer efficiency so as to effectively solve the heat dissipation problem of the high-power electronic components.

SUMMARY OF THE INVENTION

It is therefore a primary object of the present invention to provide a heat dissipation unit, which not only can transfer heat by large area, but also can transfer heat to remote end to dissipate the heat.

It is a further object of the present invention to provide the above heat dissipation unit, which not only can one-dimensionally transfer heat, but also can two-dimensionally transfer heat.

It is still a further object of the present invention to provide the above heat dissipation unit, which is a combination of a vapor chamber and a heat pipe. The heat dissipation unit can transfer and dissipate heat at higher efficiency.

It is still a further object of the present invention to provide the heat dissipation unit, in which the heat pipe passes through a housing of the vapor chamber and a heat absorption section of the heat pipe is positioned in the housing and securely supported by multiple fixing members disposed in the housing without directly contacting the housing.

To achieve the above and other objects, the heat dissipation unit of the present invention includes: a housing having a first chamber, a first capillary structure being disposed in the first chamber, a first working fluid being contained in the first chamber, multiple support posts and multiple fixing members being disposed in the first chamber; and a heat pipe disposed in the first chamber and passing through the housing to extend out of the housing, the heat pipe having a second chamber, a heat absorption section and a heat dissipation section extending from the heat absorption section, a second capillary structure being disposed in the second chamber, a second working fluid being contained in the second chamber, the heat absorption section being positioned in the first chamber of the housing and retained by the fixing members, the heat dissipation section being positioned outside the first chamber of the housing and exposed to a surrounding of the housing.

In the above heat dissipation unit, the housing has an upper casing and a lower casing. A peripheral wall is disposed on the lower casing around the first chamber. The peripheral wall defines an opening in communication with the first chamber. The upper casing is mated with the lower casing and disposed at the opening to seal the first chamber. The first chamber is positioned between the upper and lower casings.

In the above heat dissipation unit, the lower casing has a first face and a second face opposite to the first face. The peripheral wall is disposed on the first face of the lower casing. The second face of the lower casing is in contact with a surface of a heat generation component. The first capillary structure is disposed on the first face and the peripheral wall in contact with the first working fluid contained in the first chamber.

In the above heat dissipation unit, the upper casing has a third face facing the first chamber and a fourth face opposite to the third face. The first capillary structure is disposed on the third face. The fourth face serves as a heat dissipation surface.

In the above heat dissipation unit, the support posts are disposed between the first face of the lower casing and the third face of the upper casing for supporting the upper and lower casings. The support posts are made of thermally conductive metal. The thermally conductive metal is selected from a group consisting of gold, silver, copper, aluminum and a composition thereof. A layer of third capillary structure is formed on outer surfaces of the support posts to enclose the support posts. Alternatively, the support posts are porous post bodies formed of capillary structures.

In the above heat dissipation unit, the fixing members are disposed on the first face of the lower casing. Each fixing member has a free end directed to the upper casing in contact with the heat absorption section of the heat pipe to securely support the heat absorption section of the heat pipe in the first chamber.

In the above heat dissipation unit, the heat absorption section of the heat pipe is positioned between the upper and lower casings without contacting the upper casing or the lower casing. The heat absorption section of the heat pipe windingly extends along an axis of the heat pipe.

The heat dissipation unit of the present invention not only can transfer heat by large area, but also can transfer heat to remote end to dissipate the heat. Accordingly, the heat transfer effect is greatly enhanced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
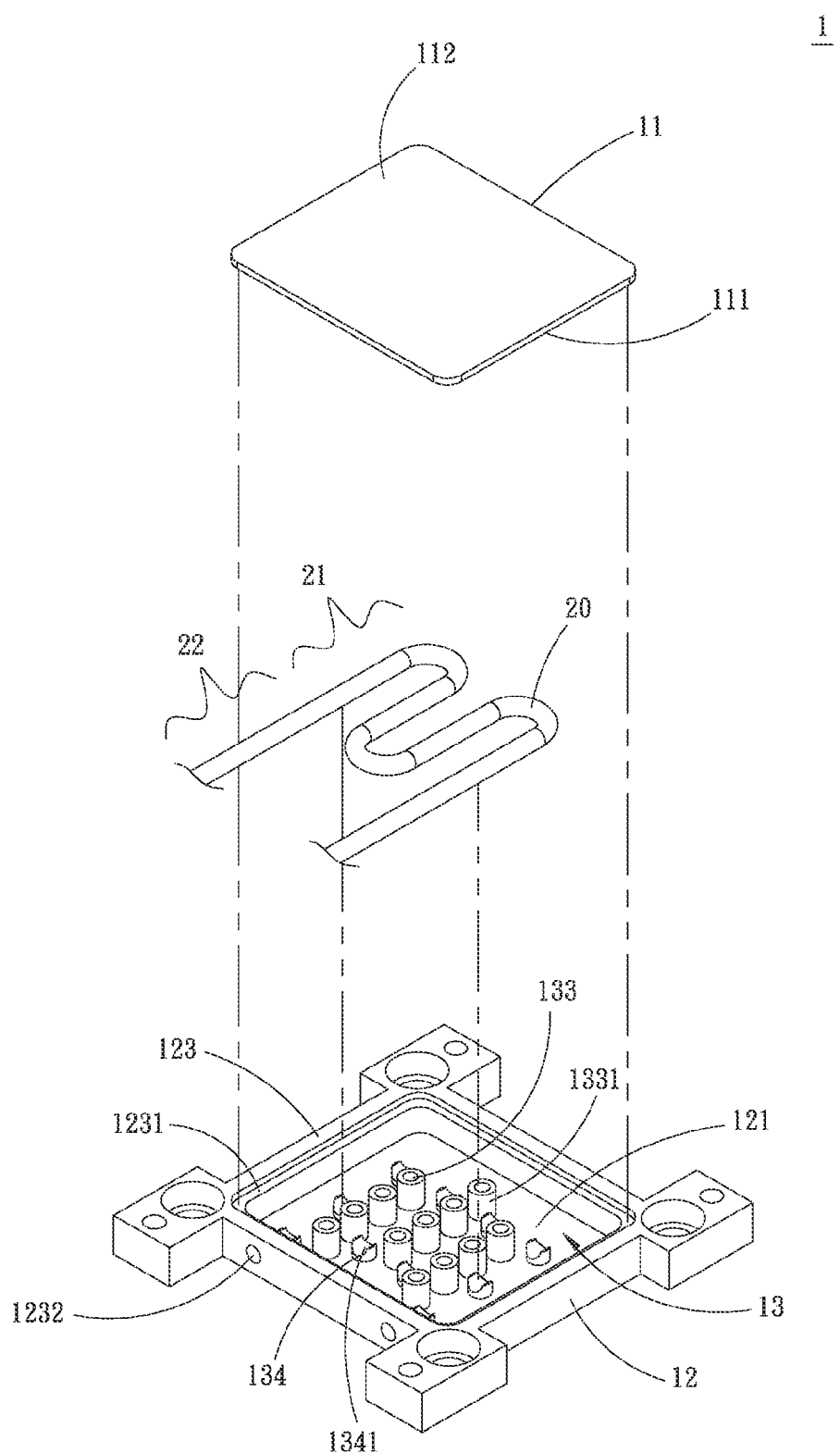
FIG. 1 is a perspective exploded view of the heat dissipation unit of the present invention.

The embodiments of the present invention will be described hereinafter with reference to the drawings, wherein the same components are denoted with the same reference numerals.

Figure 2:
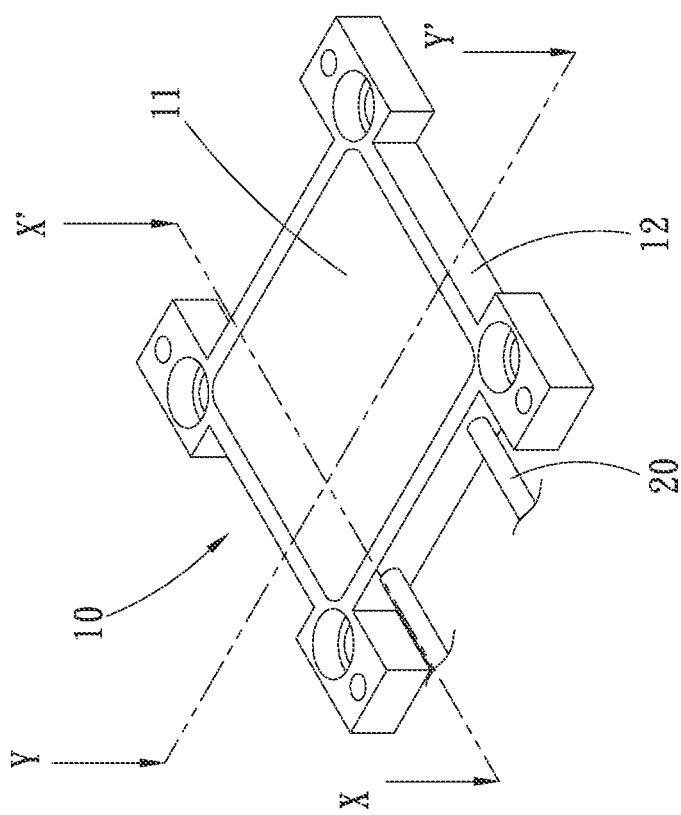
FIG. 2 is a perspective assembled view of the heat dissipation unit of the present invention.
Figure 3:
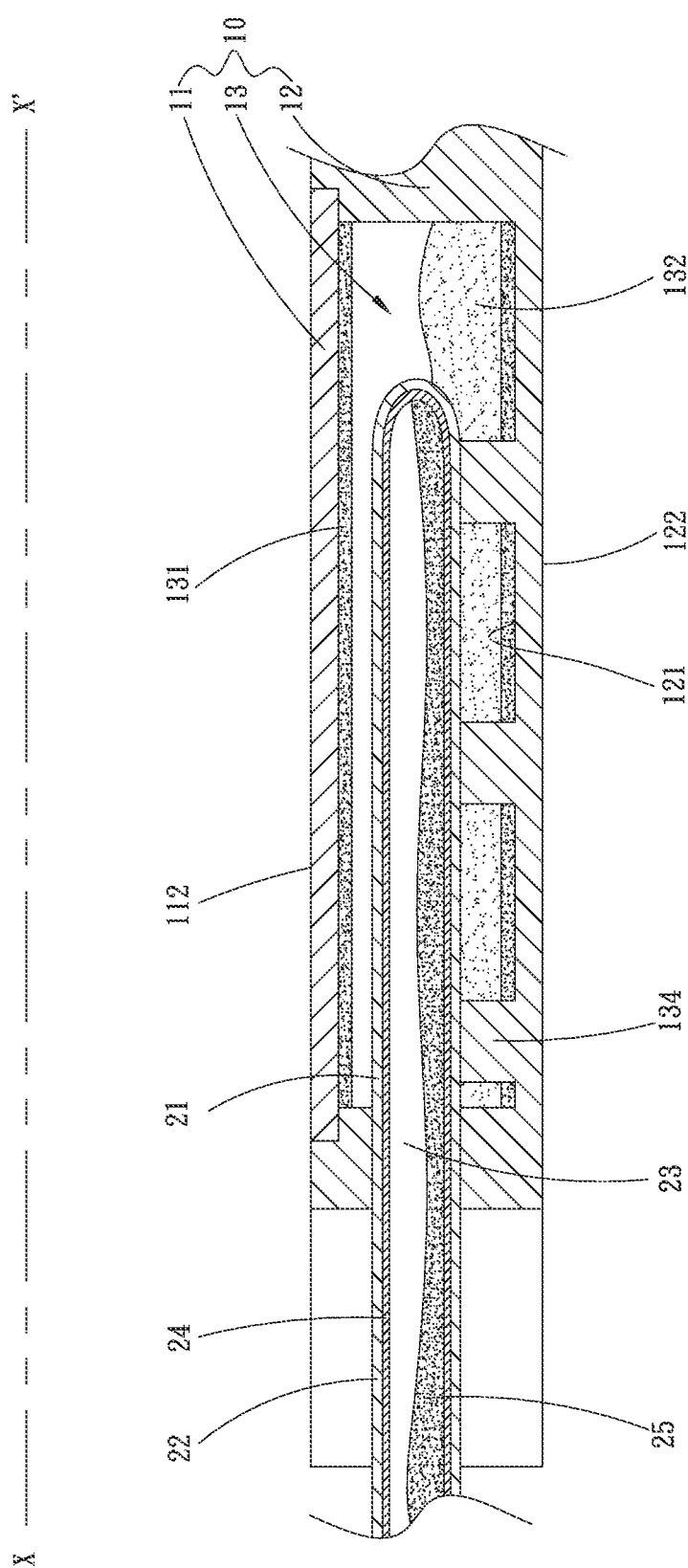
FIG. 3 is a sectional view taken along line X-X' of FIG. 2.
Figure 4:
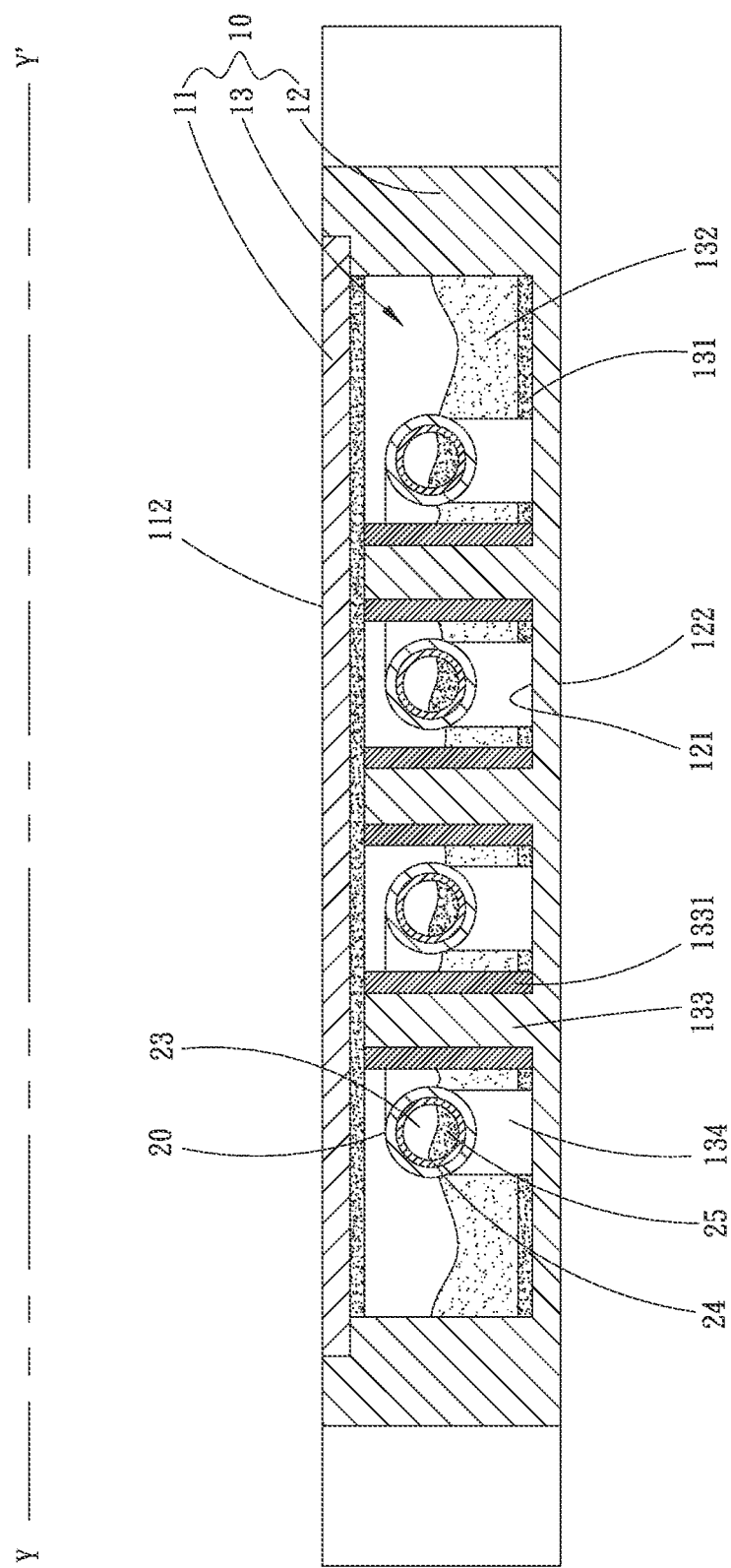
FIG. 4 is a sectional view taken along line Y-Y' of FIG. 2.

Please refer to FIGS. 1 to 4. FIG. 1 is a perspective exploded view of the present invention. FIG. 2 is a perspective assembled view of the present invention. FIG. 3 is a sectional view taken along line X-X' of FIG. 2. FIG. 4 is a sectional view taken along line Y-Y' of FIG. 2. The heat dissipation unit 1 of the present invention includes a housing 10 (as shown in FIG. 2) and a heat pipe 20. The housing 10 is made of, but not limited to, a material with good thermal conductivity, such as metal. The housing 10 has an upper casing 11, a lower casing 12 mated with the upper casing 11 and a first chamber 13 defined between the upper and lower casings 11, 12. A first capillary structure 131 is disposed in the first chamber 13. A first working fluid 132 is contained in the first chamber 13 (as shown in FIGS. 3 and 4). Multiple support posts 133 and multiple fixing members 134 are disposed in the first chamber 13. The heat pipe 20 passes through the first chamber 13 of the housing 10 and extends outward from the housing 10.

Figure 5:
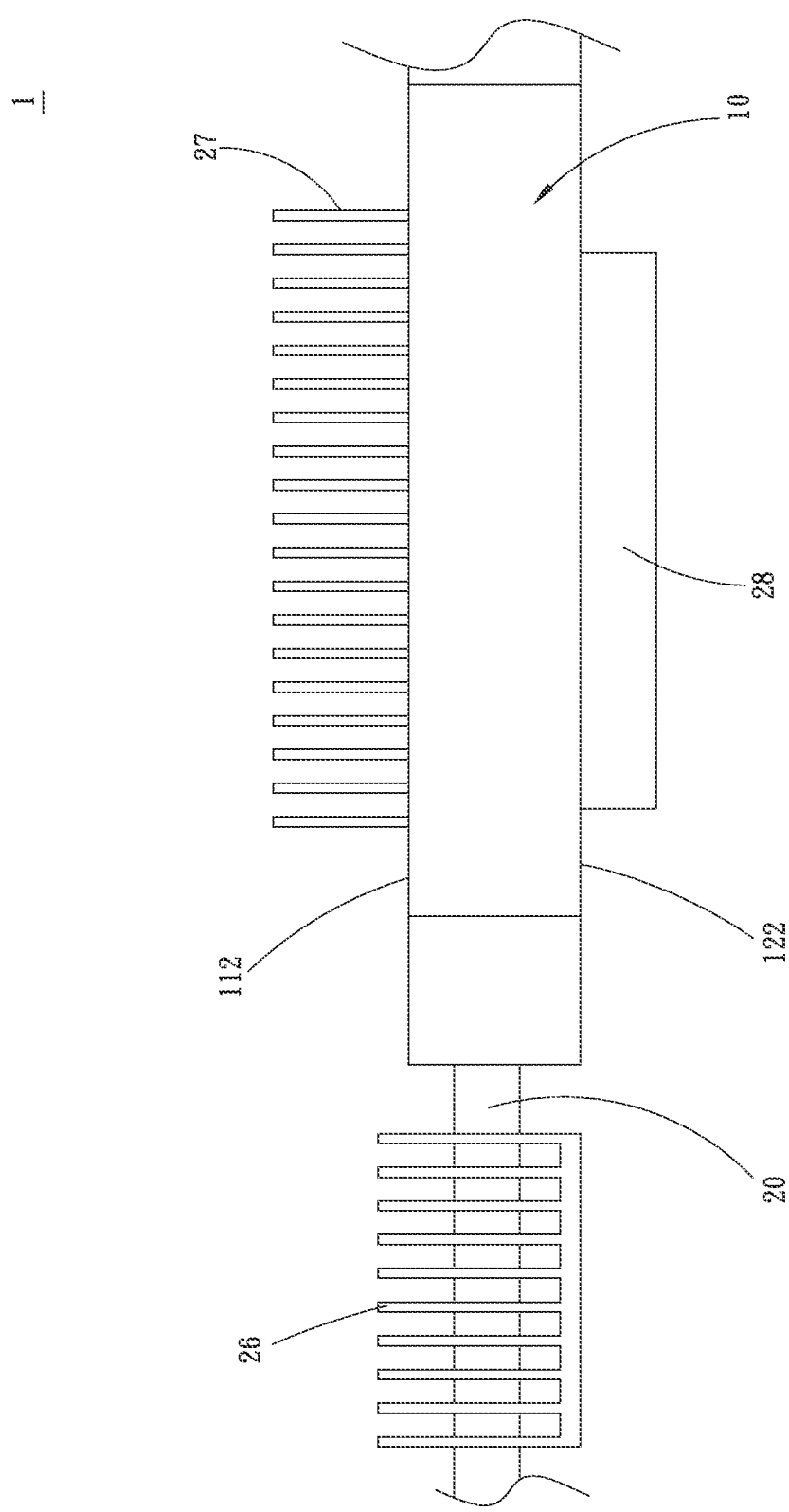
FIG. 5 is a side view showing the application of the heat dissipation unit of the present invention.

The lower casing 12 has a first face 121 and a second face 122 opposite to the first face 121. The first capillary structure 131 is disposed on the first face 121 in contact with the first working fluid 132 contained in the first chamber 13. In this embodiment, the second face 122 is a plane face for contacting a surface of a heat generation component (as shown in FIG. 5). A peripheral wall 123 is disposed on the first face 121 around the first chamber 13. An upper end of the peripheral wall 123 defines an opening 1231 in communication with the first chamber 13. The peripheral wall 123 is formed with two perforations 1232 for the heat pipe 20 to pass therethrough.

The upper casing 11 is disposed at the opening 1231 to seal the first chamber 13. The upper casing 11 has a third face 111 facing the first chamber 13 and a fourth face 112 opposite to the third face 111. The first capillary structure 131 is disposed on the third face 111. In this embodiment, the fourth face 112 is a plane face for contacting a heat dissipation component (as shown in FIG. 5). Alternatively, the fourth face 112 is free from any heat dissipation component and the heat is directly dissipated from the fourth face 112.

The heat pipe 20 is such as a circular heat pipe or a flat-plate heat pipe. In this embodiment, the heat pipe 20 is, but not limited to, a circular heat pipe. The heat pipe 20 has a second chamber 23 (as shown in FIGS. 3 and 4), a heat absorption section 21 and a heat dissipation section 22 extending from the heat absorption section 21. A second capillary structure 24 is disposed in the second chamber 23. A second working fluid 25 is contained in the second chamber 23 (as shown in FIGS. 3 and 4). The heat absorption section 21 is positioned in the first chamber 13 of the housing 10 and retained by the fixing members 134. The heat dissipation section 22 is positioned outside the first chamber 13 of the housing 10 and exposed to the surrounding of the housing 10. It should be noted that the heat absorption section 21 of the heat pipe 20 windingly extends along an axis of the heat pipe 20 to increase the heated length of the heat pipe 20.

The support posts 133 are disposed between the first face 121 of the lower casing 12 and the third face 111 of the upper casing 11 for supporting the upper and lower casings 11, 12 and avoid collapse of the housing 10 during vacuumization or after vacuumization. After the first working fluid 132 is filled into the housing 10 and the housing 10 is sealed, the support posts 133 serve to enhance the strength of the housing 10 as a whole. The support posts 133 preferably are solid post bodies made of thermally conductive metal. The thermally conductive metal is selected from a group consisting of gold, silver, copper, aluminum and a composition thereof. In another embodiment, the support posts 133 are solid post bodies made of thermally conductive metal. Moreover, a layer of third capillary structure 1331 is further formed on outer surfaces of the support posts 133 to enclose the support posts 133. The third capillary structure 1331 can be integrated with the first capillary structure 131 by means of diffusion bonding. In still another embodiment, the support posts 133 are porous post bodies formed of capillary structures of sintered metal powder. It should be noted that the third capillary structure 1331 or the support posts 133 formed of capillary structures serve to speed the capillary backflow, whereby the cooled and liquidized first working fluid 132 near the upper casing 11 can quickly flow back to the lower casing 12 under capillary attraction.

The fixing members 134 are upright disposed on the first face 121 of the lower casing 12. Each fixing member 134 has a free end 1341, which is directed upward without contacting the upper casing 11. The free ends 1341 are in contact with the heat absorption section 21 of the heat pipe 20. The free ends 1341 have a configuration in adaptation to that of the heat pipe 20, whereby the heat absorption section 21 of the heat pipe 20 is securely supported by the fixing members 134 in the first chamber 13.

In addition, the support posts 133 and the fixing members 134 are alternately disposed in the first chamber 13 in row. Each row of support posts 133 is adjacent to a row of fixing members 134. According to such arrangement, the windingly extending heat absorption section 21 is wound around the support posts 133. Under such circumstance, the heat of the second face 122 of the lower casing 12 can be uniformly transferred through the fixing members 134 of the first face 121 to the heat absorption section 21 of the heat pipe 20. Furthermore, after the lower casing 12 is heated, the first working fluid 132 in the first chamber 13 is changed from liquid phase into vapor phase to transfer the heat to the upper casing 11 for dissipating the heat. When the vapor first working fluid 132 moves to the upper casing 11, the vapor first working fluid 132 will pass through the heat absorption section 21 of the heat pipe 20. In this case, part of the heat is absorbed by the heat absorption section 21 of the heat pipe 20 to be dissipated through the heat pipe 20. On the other hand, the heat pipe 20 avoids the support posts 133 so that most of the cooled and liquidized first working fluid 132 will flow back to the lower casing 12 along the third capillary structures 1331 of the support posts 133 under capillary attraction. Accordingly, the liquid first working fluid 132 will not drop onto the heat absorption section 21 of the heat pipe 20 to affect the heat absorption effect thereof.

Also, in this embodiment, the heat absorption section 21 of the heat pipe 20 is supported by the fixing members 134 and positioned between the upper and lower casings 11, 12 without contacting the first face 121 of the lower casing 12 and the third face 111 of the upper casing 11 (as shown in FIGS. 3 and 4). Under such circumstance, the first working fluid 132 cooled and liquidized on the upper casing 11 and/or the first working fluid 132 about to change from liquid phase to vapor phase on the lower casing 12 is prevented from affecting the heat absorption effect of the heat absorption section 21 of the heat pipe 20.

It should be also noted that the second working fluid 25 of the heat absorption section 21 of the heat pipe 20 is heated to change from liquid phase into vapor phase to transfer the heat to the heat dissipation section 22 for dissipating the heat. The second working fluid 25 is cooled and liquidized at the heat dissipation section 22 to flow back to the heat absorption section 21 along the second capillary structure 24 under capillary attraction for next heat transfer circulation.

In this embodiment, the first, second and third capillary structures 131, 24, 1331 are, but not limited to, sintered metal powder. Alternatively, the first, second and third capillary structures 131, 24, 1331 can be mesh bodies or fiber bodies.

Please now refer to FIG. 5, which shows an application of the present invention. Also referring to FIGS. 1 to 4, the bottom face of the housing 10, that is, the second face 122 of the lower casing 12 is positioned on a surface of a heat generation component 28 such as a CPU. A heat dissipation component such as a first radiating fin assembly 27 is disposed on the top face of the housing 10, that is, the fourth face 112 of the upper casing 11. Another heat dissipation component such as a second radiating fin assembly 26 is disposed at the heat dissipation section 22 of the heat pipe 20, that is, an end of the heat pipe 20 distal from the heat dissipation section 21.

The heat generated by the heat generation component 28 is transferred from the second face 122 of the lower casing 12 to the first face 121, whereby the liquid first working fluid 132 contained in the first chamber 13 is heated and evaporated into vapor first working fluid 132. The vapor first working fluid 132 transfers the heat to the third face 111 of the upper casing 11. At the same time, the first working fluid 132 transfers the heat to the heat absorption section 21 of the heat pipe 20. Also, the heat generated by the heat generation component 28 is transferred from the second face 122 of the lower casing 12 to the first face 121 and transferred through the fixing members 134 to the heat absorption section 21 of the heat pipe 20. The heat pipe 20 is able to quickly one-way transfer heat so that the heat of the heat absorption section 21 is quickly transferred to the heat dissipation section 22 for the second radiating fin assembly 26 to dissipate the heat. On the other hand, the heat generated by the heat generation component 28 is quickly transferred to the fourth face 112 of the upper casing 11 and uniformly spread over the effective area of the fourth face 112. Then the heat is dissipated through the first radiating fin assembly 27.

In conclusion, the heat dissipation unit of the present invention not only can transfer heat by large area, but also can transfer heat to remote end to dissipate the heat. Accordingly, the heat transfer effect is greatly enhanced.

The present invention has been described with the above embodiments thereof and it is understood that many changes and modifications in the above embodiments can be carried out without departing from the scope and the spirit of the invention that is intended to be limited only by the appended claims.

What is claimed is:

1. A heat dissipation unit comprising:
a housing having a first chamber, a first capillary structure being disposed in the first chamber, a first working fluid being contained in the first chamber, multiple support posts and multiple fixing members being disposed in the first chamber, the support posts being supported in the first chamber, and each fixing member having a height shorter than each support post; and
a heat pipe disposed in the first chamber and passing through the housing to extend out of the housing, the heat pipe having a second chamber, a heat absorption section and a heat dissipation section extending from the heat absorption section, a second capillary structure being disposed in the second chamber, a second working fluid being contained in the second chamber, the second working fluid not communicating with the first working fluid, the heat absorption section being positioned in the first chamber of the housing and retained by the fixing members, the heat dissipation section being positioned outside the first chamber of the housing and exposed to a surrounding of the housing;
wherein each fixing member has a free end in contact with the heat absorption section of the heat pipe to securely support the heat absorption section of the heat pipe in the first chamber.

2. The heat dissipation unit as claimed in claim 1, wherein the housing has an upper casing and a lower casing, a peripheral wall being disposed on the lower casing around the first chamber, the peripheral wall defining an opening in communication with the first chamber, the upper casing being mated with the lower casing and disposed at the opening to seal the first chamber, the first chamber being positioned between the upper and lower casings.

3. The heat dissipation unit as claimed in claim 2, wherein the lower casing has a first face and a second face opposite to the first face, the first capillary structure being disposed on the first face in contact with the first working fluid contained in the first chamber, the second face of the lower casing being in contact with a surface of a heat generation component, the peripheral wall being disposed on the first face of the lower casing.

4. The heat dissipation unit as claimed in claim 3, wherein the upper casing has a third face facing the first chamber and a fourth face opposite to the third face, the first capillary structure being disposed on the third face.

5. The heat dissipation unit as claimed in claim 4, wherein the support posts are made of thermally conductive metal, the thermally conductive metal being selected from a group consisting of gold, silver, copper, aluminum and a composition thereof.

6. The heat dissipation unit as claimed in claim 5, wherein a layer of third capillary structure is formed on outer surfaces of the support posts to enclose the support posts.

7. The heat dissipation unit as claimed in claim 6, wherein the layer of third capillary structure is integrated with the first capillary structure by means of diffusion bonding.

8. The heat dissipation unit as claimed in claim 5, wherein the support posts are porous post bodies formed of capillary structures.

9. The heat dissipation unit as claimed in claim 5, wherein the fixing members are disposed on the first face of the lower casing.

10. The heat dissipation unit as claimed in claim 9, wherein the heat absorption section of the heat pipe is positioned between the upper and lower casings without contacting the first face of the lower casing and the third face of the upper casing.

11. The heat dissipation unit as claimed in claim 10, wherein the heat absorption section of the heat pipe windingly extends along an axis of the heat pipe.

12. The heat dissipation unit as claimed in claim 11, wherein the support posts and the fixing members are alternately arranged in row, each row of support posts being adjacent to a row of fixing members.

13. The heat dissipation unit as claimed in claim 12, wherein the heat absorption section of the heat pipe is positioned around the support posts.

* * * * *